(12) United States Patent
Fan

(10) Patent No.: US 10,872,577 B2
(45) Date of Patent: Dec. 22, 2020

(54) SHIFT REGISTER, CIRCUIT AND DRIVING METHOD THEREOF, GATE DRIVE CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Jun Fan, Beijing (CN)

(73) Assignees: BOE TECHNOLOGY GROUP CO., LTD., Beijing (CN); ORDOS YUANSHENG OPTOELECTRONICS CO, LTD., Inner Mongolia (CN)

( * ) Notice: Subject to any disclaimer, the term of this patent is extended or adjusted under 35 U.S.C. 154(b) by 380 days.

(21) Appl. No.: 15/753,238

(22) PCT Filed: Aug. 25, 2017

(86) PCT No.: PCT/CN2017/099005
§ 371 (c)(1),
(2) Date: Feb. 16, 2018

(87) PCT Pub. No.: WO2018/129928
PCT Pub. Date: Jul. 19, 2018

(65) Prior Publication Data
US 2020/0219458 A1    Jul. 9, 2020

(30) Foreign Application Priority Data

Jan. 16, 2017    (CN) .......................... 2017 1 0028872

(51) Int. Cl.
*G09G 3/36*    (2006.01)
*G09G 3/3266*    (2016.01)
(Continued)

(52) U.S. Cl.
CPC ......... *G09G 3/3677* (2013.01); *G09G 3/3266* (2013.01); *G11C 7/1036* (2013.01);
(Continued)

(58) Field of Classification Search
CPC ............... G09G 3/3233; G09G 3/3266; G09G 2300/0819; G09G 2300/0842;
(Continued)

(56) References Cited

U.S. PATENT DOCUMENTS

2014/0133621 A1    5/2014  Shang
2016/0019833 A1*   1/2016  Wei ...................... G09G 3/3266
                                                       345/690

(Continued)

FOREIGN PATENT DOCUMENTS

CN    202434192 U    9/2012
CN    104978943 A    10/2015
(Continued)

OTHER PUBLICATIONS

Search Report for International Application No. PCT/CN2017/099005 dated Oct. 19, 2017.
(Continued)

*Primary Examiner* — Nelson M Rosario
(74) *Attorney, Agent, or Firm* — Calfee, Halter & Griswold LLP

(57) ABSTRACT

A shift register circuit is disclosed that includes an initialization circuit, a first node control circuit, a second node control circuit, and an output circuit. The initialization circuit is configured to set a first node to an inactive potential in response to an initialization pulse from an initialization terminal being active. The initialization pulse is immediately prior to an input pulse applied to an input terminal.

11 Claims, 7 Drawing Sheets

(51) Int. Cl.
  *G11C 7/10* (2006.01)
  *G11C 19/18* (2006.01)
  *G11C 19/28* (2006.01)

(52) U.S. Cl.
  CPC ............ *G11C 19/182* (2013.01); *G11C 19/28* (2013.01); *G09G 2310/0283* (2013.01); *G09G 2310/0286* (2013.01)

(58) Field of Classification Search
  CPC ... G09G 2300/0861; G09G 2310/0262; G09G 2310/0278; G09G 2310/0286
  See application file for complete search history.

(56) References Cited

U.S. PATENT DOCUMENTS

| 2016/0225336 A1 | 8/2016 | Gu et al. |
| 2017/0178582 A1 | 6/2017 | Li et al. |
| 2017/0316751 A1 | 11/2017 | Wang |
| 2018/0151148 A1* | 5/2018 | Wu .................... G11C 19/184 |

FOREIGN PATENT DOCUMENTS

| CN | 105185339 A | 12/2015 |
| CN | 204966019 U | 1/2016 |
| CN | 105427829 A | 3/2016 |
| CN | 106157867 A | 11/2016 |
| CN | 106652876 A | 5/2017 |
| KR | 20140148235 A | 12/2014 |

OTHER PUBLICATIONS

First Office Action for Chinese Patent Application No. 201710028872.2 dated Mar. 4, 2019.

\* cited by examiner

SHIFT REGISTER, CIRCUIT AND DRIVING METHOD THEREOF, GATE DRIVE CIRCUIT AND DISPLAY DEVICE

CROSS-REFERENCE TO RELATED APPLICATIONS

The present application is the U.S. national phase entry of PCT/CN2017/099005, with an international filing date of Aug. 25, 2017, which claims the benefit of Chinese Patent Application No. 201710028872.2, filed on Jan. 16, 2017, the entire disclosures of which are incorporated herein by reference.

TECHNICAL FIELD

The present disclosure relates to the field of display driving technology, and in particular, to a shift register circuit, a method of driving the shift register circuit, a gate drive circuit and a display apparatus.

BACKGROUND

The gate drive circuit of a display apparatus typically includes a plurality of cascaded shift register circuits that sequentially output gate drive signals. When the gate drive circuit is not initialized, one or more internal nodes within the shift register circuit may be in an indefinite state, resulting in erroneous operation of the gate drive circuit. This may further cause an abnormality of the image displayed by the display apparatus.

SUMMARY

It would be advantageous to provide a shift register circuit that may alleviate, mitigate or eliminate at least one of the above problems.

According to an aspect of the present disclosure, a shift register circuit is provided comprising: an initialization circuit configured to set a first node at an inactive potential in response to an initialization pulse from an initialization terminal being active; a first node control circuit configured to set the first node at an active potential in response to an input pulse from an input terminal being active and to set the first node at the inactive potential in response to at least one of a reset pulse from a reset terminal being active or a second node being at the active potential, the input pulse being immediately subsequent to the initialization pulse; a second node control circuit configured to set the second node at the inactive potential in response to the first node being at the active potential and to set the second node at the active potential in response to the first node being at the inactive potential and a first clock signal from a first clock terminal being active; and an output circuit configured to set an output terminal at the active potential in response to the first node being at the active potential and a second clock signal from a second clock terminal being active and to set the output terminal at the inactive potential in response to the second node being at the active potential.

In certain exemplary embodiments, the first node control circuit comprises: a first transistor having a gate connected to the input terminal, a first electrode connected to the first node, and a second electrode connected to a first scan level terminal; a second transistor having a gate connected to the reset terminal, a first electrode connected to a second scan level terminal, and a second electrode connected to the first node; and a fifth transistor having a gate connected to the second node, a first electrode connected to the first node, and a second electrode connected to a reference level terminal supplying the inactive potential.

In certain exemplary embodiments, the second node control circuit comprises: a sixth transistor having a gate connected to the first node, a first electrode connected to a reference level terminal supplying the inactive potential, and a second electrode connected to the second node; and a seventh transistor having a gate connected to the first clock terminal, a first electrode connected to the second node, and a second electrode connected to the first clock terminal.

In certain exemplary embodiments, the output circuit comprises: a third transistor having a gate connected to the first node, a first electrode connected to the output terminal, and a second electrode connected to the second clock terminal; a first capacitor connected between the first node and the output terminal; and a fourth transistor having a gate connected to the second node, a first electrode connected to a reference level terminal supplying the inactive potential, and a second electrode connected to the output terminal.

In certain exemplary embodiments, the initialization circuit is configured to directly set the first node at the inactive potential. In certain exemplary embodiments, the initialization circuit comprises an eighth transistor having a gate connected to the initialization terminal, a first electrode connected to a reference level terminal supplying the inactive potential, and a second electrode connected to the first node.

In certain exemplary embodiments, the initialization circuit is configured to set the first node at the inactive potential by way of the first node control circuit by setting the second node at the active potential. In certain exemplary embodiments, the initialization circuit comprises an eighth transistor having a gate connected to the initialization terminal, a first electrode connected to the initialization terminal, and a second electrode connected to the second node.

In certain exemplary embodiments, the second node control circuit further comprises a second capacitor connected between the second node and the reference level terminal.

According to another aspect of the present disclosure, a method is provided for driving the shift register circuit as described above. The method comprises setting the first node at the inactive potential in response to the initialization pulse from the initialization terminal being active. The initialization pulse is immediately prior to the input pulse applied to the input terminal.

According to yet another aspect of the present disclosure, a gate drive circuit is provided comprising n cascaded shift register circuits as described above, n being an integer greater than or equal to 2. The input terminal of each of the shift register circuits, except a first one of the shift register circuits, is connected to the output terminal of an adjacent previous shift register circuit, and the reset terminal of each of the shift register circuits, except an n-th one of the shift register circuits, is connected to the output terminal of an adjacent next shift register circuit.

In certain exemplary embodiments, the gate drive circuit is configured to operate in a forward scan mode. The input terminal of the first shift register circuit is operative to receive a start signal as the input pulse. The initialization terminal of the first shift register circuit is operative to receive the initialization pulse. The initialization terminal of a second one of the shift register circuits is operative to receive the start signal as the initialization pulse. The initializing terminal of a k-th one of the shift register circuits is connected to the output terminal of a (k−2)-th one of the shift register circuits, k being an integer and 2<k≤n.

In certain exemplary embodiments, the gate drive circuit is configured to operate in a reverse scan mode. The reset terminal of the n-th shift register circuit is operative to receive a start signal as the input pulse. The initialization terminal of the n-th shift register circuit is operative to receive the initialization pulse. The initialization terminal of an (n−1)-th one of the shift register circuits is operative to receive the start signal as the initialization pulse. The initializing terminal of a k-th one of the shift register circuits is connected to the output terminal of a (k+2)-th one of the shift register circuits, k being an integer and 1≤k≤n−2.

According to still yet another aspect of the present disclosure, a display apparatus is provided comprising the gate drive circuit as described above.

These and other aspects of the present disclosure will be apparent from and elucidated with reference to the embodiment(s) described hereinafter.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure are described in detail below with reference to the accompanying drawings.

Figure 1:
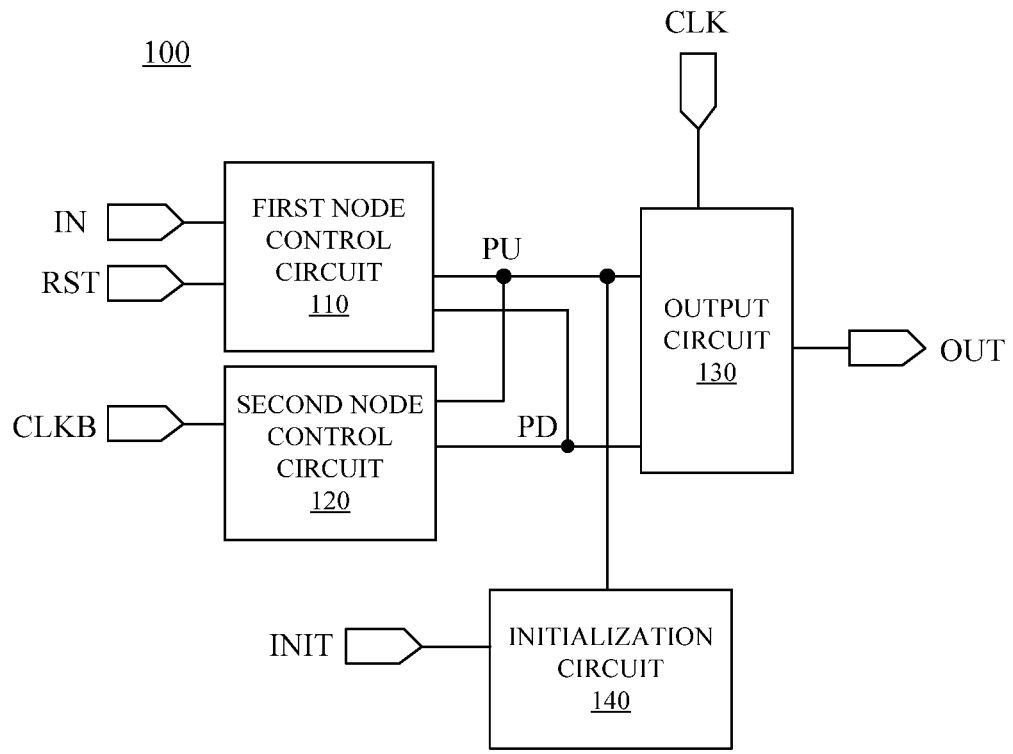
FIG. 1 is a block diagram of a shift register circuit according to an embodiment of the present disclosure.

FIG. 1 is a block diagram of a shift register circuit 100 according to an embodiment of the present disclosure. Referring to FIG. 1, the shift register 100 includes a first node control circuit 110, a second node control circuit 120, an output circuit 130, and an initialization circuit 140.

The first node control circuit 110 is configured to set a first node PU at an active potential in response to an input pulse from an input terminal IN being active. The first node control circuit 110 is also configured to set the first node PU at an inactive potential in response to at least one of a reset pulse from a reset terminal RST being active or a second node PD being at the active potential.

The second node control circuit 120 is configured to set the second node PD at the inactive potential in response to the first node PU being at the active potential. The second node control circuit 120 is also configured to set the second node PD in the active state in response to the first node PU being at the inactive potential and a first clock signal from a first clock terminal CLKB being active.

The output circuit 130 is configured to set an output terminal OUT at the active potential in response to the first node PU being at the active potential and a second clock signal from a second clock terminal CLK being active. The output circuit 130 is also configured to set the output terminal OUT at the inactive potential in response to the second node PD being at the active potential.

The initialization circuit 140 is configured to set the first node PU at the inactive potential in response to an initialization pulse from an initialization terminal INIT being active. The initialization pulse is immediately before the input pulse applied to the input terminal IN. In other words, the input pulse is immediately subsequent to the initialization pulse.

By means of the initialization circuit 140, the internal node (specifically, the first node PU) of the shift register circuit 100 is initialized in a definite (specifically, inactive) state before the input pulse is supplied to the shift register 100. This may prevent the shift register circuit 100 from mis-operation.

The term "active potential" as used herein refers to a potential at which a circuit element involved (e.g., a transistor) is enabled. In contrast, the term "inactive potential" refers to a potential at which the circuit element involved is disabled. For n-type transistors, the active potential is high and the inactive potential is low. For p-type transistors, the active potential is low and the inactive potential is high.

Figure 2:
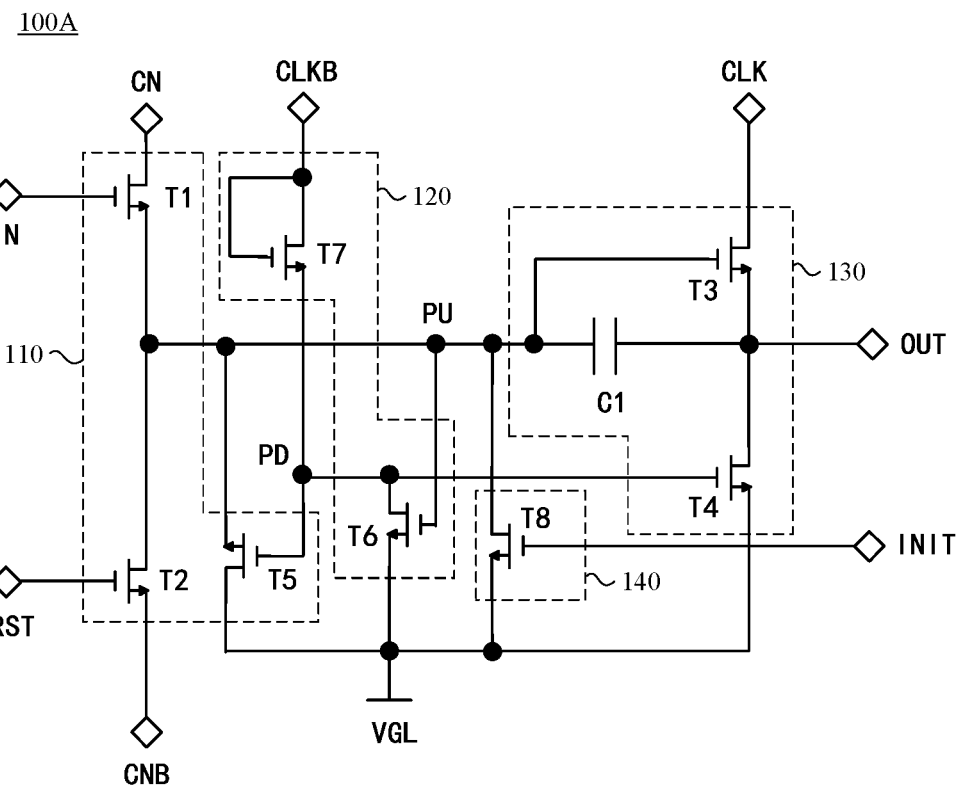
FIG. 2 is a circuit diagram illustrating an example circuit of the shift register circuit of FIG. 1.

FIG. 2 is a circuit diagram illustrating an example circuit 100A of the shift register circuit 100 of FIG. 1. An example configuration of the shift register circuit 100 of FIG. 1 is described below with reference to FIG. 2.

The first node control circuit 110 includes a first transistor T1, a second transistor T2, and a fifth transistor T5. The first transistor T1 has a gate connected to the input terminal IN, a first electrode connected to the first node PU, and a second electrode connected to the first scan level terminal CN. The second transistor T2 has a gate connected to the reset terminal RST, a first electrode connected to the second scan level terminal CNB, and a second electrode connected to the first node PU. The fifth transistor T5 has a gate connected to the second node PD, a first electrode connected to the first node PU, and a second electrode connected to a reference level terminal VGL supplying the inactive potential.

The second node control circuit 120 includes a sixth transistor T6 and a seventh transistor T7. The sixth transistor T6 has a gate connected to the first node PU, a first electrode connected to the reference level terminal VGL supplying the inactive potential, and a second electrode connected to the second node PD. The seventh transistor T7 has a gate connected to the first clock terminal CLKB, a first electrode connected to the second node PD, and a second electrode connected to the first clock terminal CLKB.

The output circuit 130 includes a third transistor T3, a first capacitor C1, and a fourth transistor T4. The third transistor T3 has a gate connected to the first node PU, a first electrode connected to the output terminal OUT, and a second electrode connected to the second clock terminal CLK. The first capacitor C1 is connected between the first node PU and the output terminal OUT. The fourth transistor T4 has a gate connected to the second node PD, a first electrode connected to the reference level terminal VGL supplying the inactive potential, and a second electrode connected to the output terminal OUT.

In this example, the initialization circuit 140 is configured to directly set the first node PU at the inactive potential. Specifically, the initialization circuit 140 includes an eighth transistor T8 having a gate connected to the initialization terminal INIT, a first electrode connected to the reference level terminal VGL supplying the inactive potential, and a second electrode connected to the first node PU.

Figure 3:
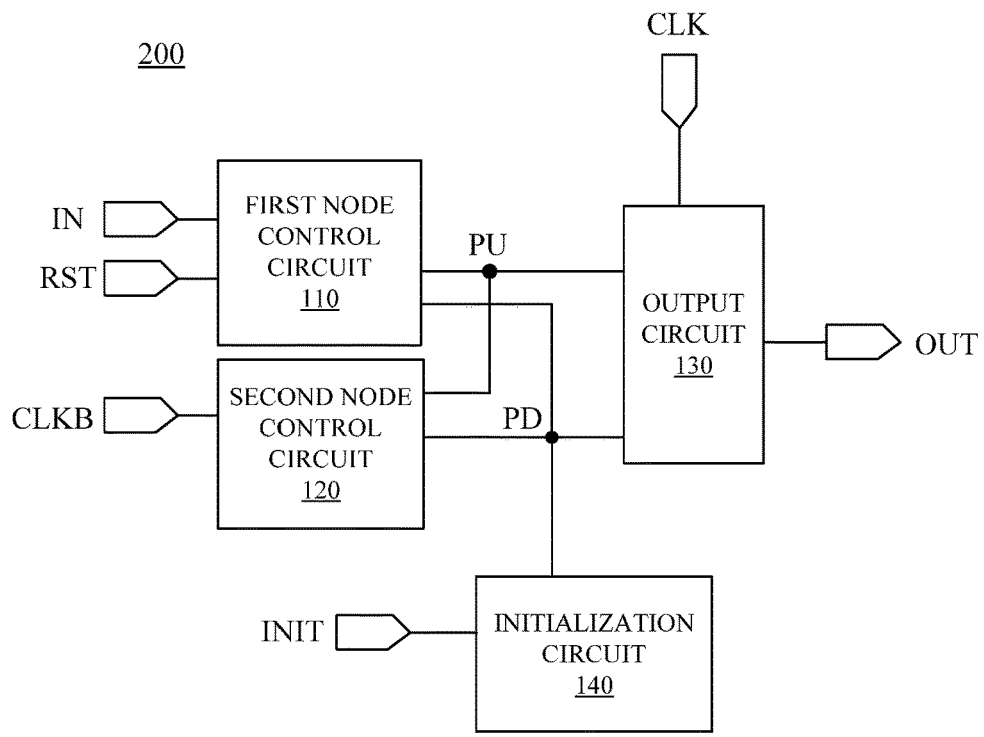
FIG. 3 is a block diagram of a shift register circuit in accordance with an embodiment of the present disclosure.

FIG. 3 is a block diagram of a shift register circuit 200 according to an embodiment of the present disclosure. Referring to FIG. 3, the shift register 200 includes a first node control circuit 110, a second node control circuit 120, an output circuit 130, and an initialization circuit 140. The same reference numerals as in FIG. 1 denote the same elements as in FIG. 1.

The shift register 200 differs from the shift register circuit 100 of FIG. 1 in that the initialization circuit 140 is connected to the second node PD instead of the first node PU. This is based on the recognition that the first node PU can be set at the inactive potential by means of the first node control circuit 110 by setting the second node PD at the active potential. This may be advantageous because both the first node PU and the second node PD are now initialized in a certain state.

Figure 4:
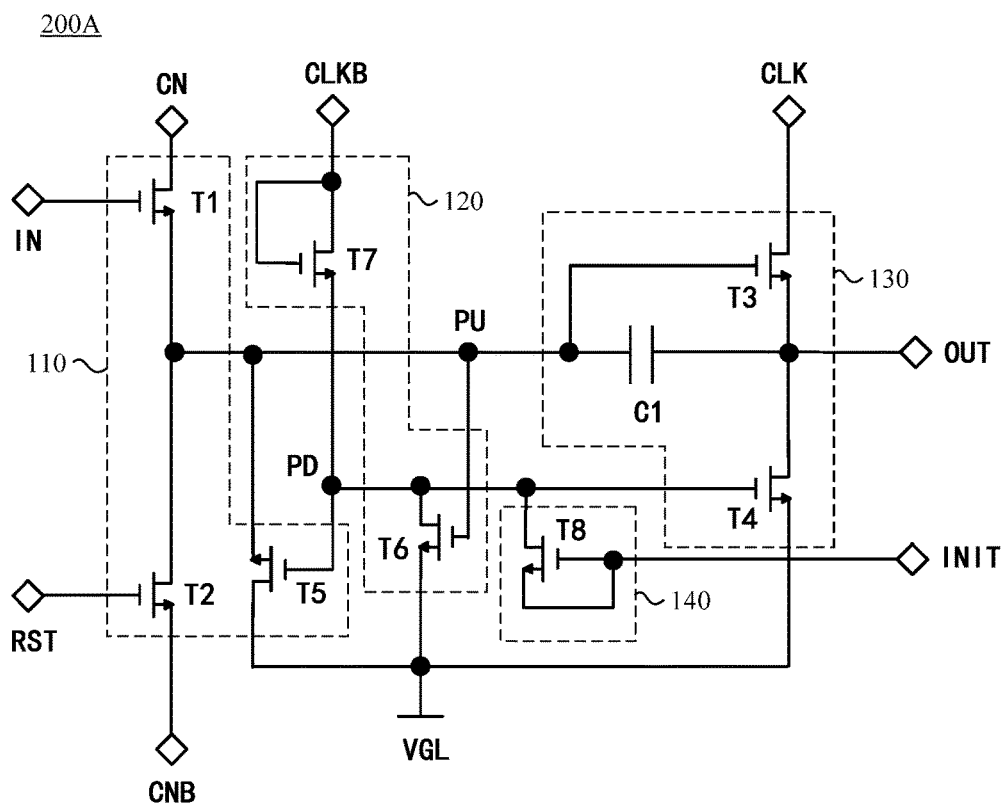
FIG. 4 is a circuit diagram illustrating an example circuit of the shift register circuit of FIG. 3.

FIG. 4 is a circuit diagram illustrating an example circuit 200A of the shift register circuit 200 of FIG. 3. The configurations of the first node control circuit 110, the second node control circuit 120, and the output circuit 130 are the same as those described above with respect to FIG. 2 and will not be repeated here.

In this example, the initialization circuit 140 is connected to the second node PD instead of the first node PU. Specifically, the initialization circuit 140 includes an eighth transistor T8 having a gate connected to the initialization terminal INIT, a first electrode connected to the initialization terminal INIT, and a second electrode connected to the second node PD.

Figure 5:
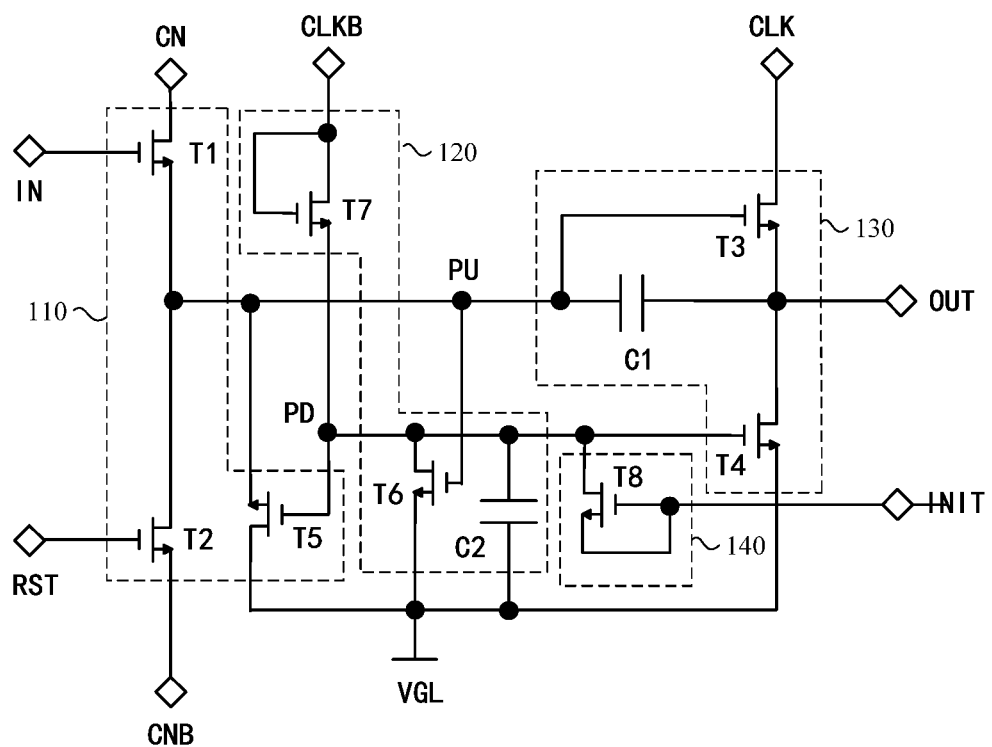
FIG. 5 is a circuit diagram illustrating another example circuit of the shift register circuit of FIG. 3.

FIG. 5 is a circuit diagram illustrating another example circuit 200B of the shift register circuit 200 of FIG. 3. The configurations of the first node control circuit 110, the output circuit 130, and the initialization circuit 140 are the same as those described above with respect to FIG. 4 and will not be repeated here.

In this example, the second node control circuit 120 further includes a second capacitor C2 connected between the second node PD and the reference level terminal VGL. This may be advantageous because the second capacitor C2 may maintain the second node PD at the active potential, and thus maintain the first node PU at the inactive potential, as will be described below.

Figure 6:
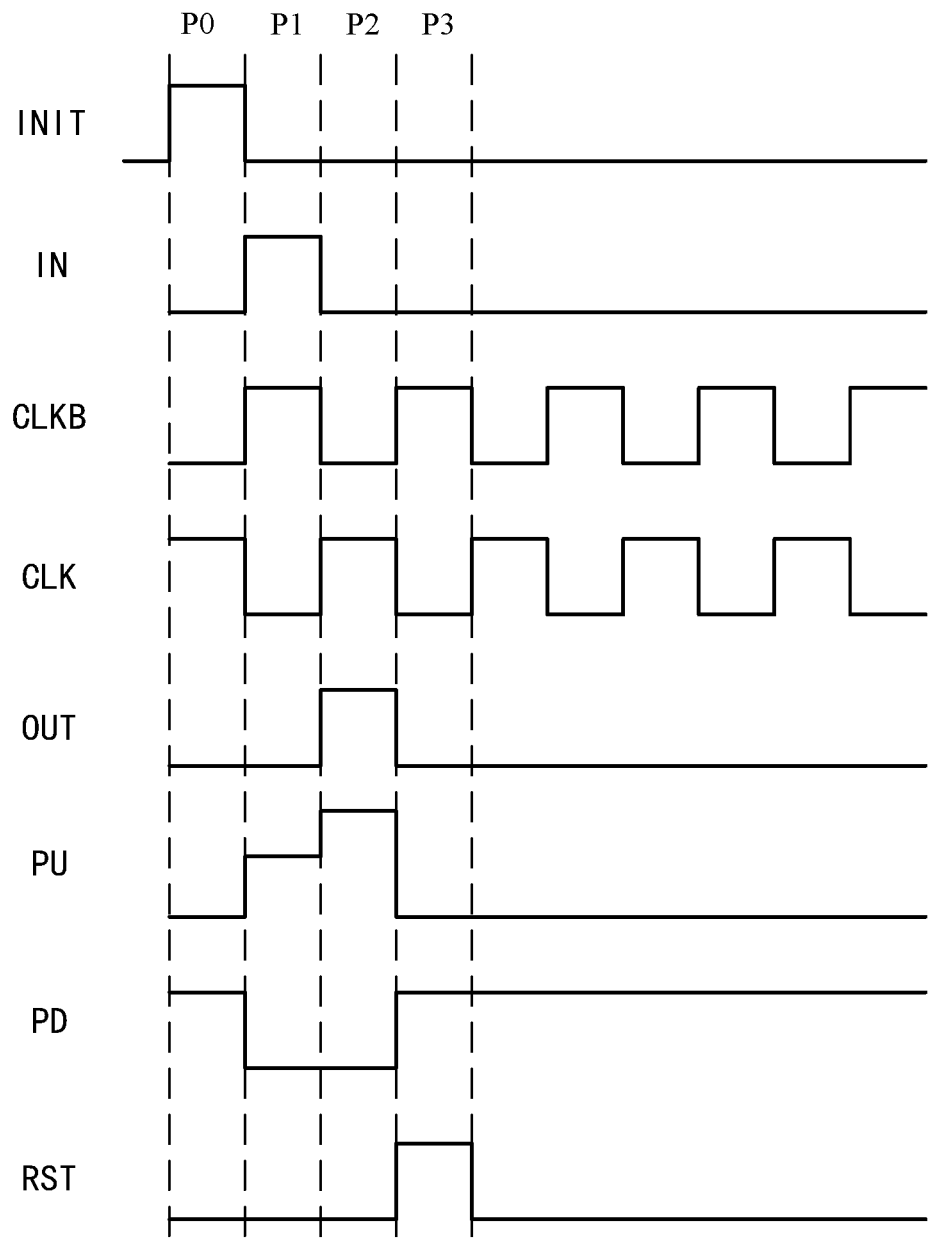
FIG. 6 is a timing diagram for the example shift register circuit shown in FIG. 5.

FIG. 6 is a timing diagram for the example shift register circuit 200B shown in FIG. 5. The operation of the example circuit 200B is described below with reference to FIG. 6. In the following, a high level is indicated by 1 and a low level is indicated by 0. It is also assumed that the first scan level terminal CN supplies a high level voltage and that the second scan level terminal CNB and the reference level terminal VGL supply a low level voltage.

In phase P0, INIT=1. The eighth transistor T8 is turned on, and the initialization pulse from the initialization terminal INIT is transferred to the second node PD to charge the second capacitor C2. Therefore, the second node PD is set at an active potential (a high potential in this example). The fifth transistor T5 is turned on, and the low level voltage from the reference level terminal VGL is transferred to the first node PU. Therefore, the first node PU is set at an inactive potential (a low potential in this example). The initialization is then finished.

In phase P1, IN=1, CLKB=1, CLK=0, RST=0. As IN=1, the first transistor T1 is turned on and the high level voltage from the first scan level terminal CN is transferred to the first node PU so that the first node PU is set at the active potential and thus the sixth Transistor T6 is on. As CLKB=1, the seventh transistor T7 is turned on. The turned-on sixth transistor T6 and seventh transistor T7 have a resistor divider effect. The sixth transistor T6 and the seventh transistor T7 are designed so that the equivalent resistance of the sixth transistor T6 is much smaller than the equivalent resistance of the seventh transistor T7. In this way, the second node PD is set at the inactive potential, and the second capacitor C2 is discharged through the sixth transistor T6. Since the first node PU is at the active potential, the third transistor T3 is turned on and the inactive clock signal from the second clock terminal CLK is transferred to the output terminal OUT.

In phase P2, IN=0, CLKB=0, CLK=1, RST=0. As IN=0 and CLKB=0, the first transistor T1 and the seventh transistor T7 are turned off. The first capacitor C1 keeps the first node PU at a high level, so that the third transistor T3 and the sixth transistor T6 are turned on. The turned-on third transistor T3 transfers the active clock signal from the second clock terminal CLK to the output terminal OUT so that the output terminal OUT outputs an active level signal. The second capacitor C2 continues to discharge through the sixth transistor T6. Due to the self-boosting effect of the first capacitor C1, the potential of the first node PU is further pulled up. The turned-on sixth transistor T6 transfers the low level voltage from the reference level terminal VGL to the second node PD so that the second node PD remains at the inactive potential.

In phase P3, IN=0, CLKB=1, CLK=0, RST=1. As RST=1, the second transistor T2 is turned on and the low-level voltage from the second scan-level terminal CNB is transferred to the first node PU so that the first node PU is set at the inactive potential and the third transistor T3 and the sixth transistor T6 are turned off. As CLKB=1, the seventh transistor T7 is turned on so that the active clock signal from the first clock terminal CLKB is transferred to the second node PD and the second capacitor C2 is charged. Therefore, the second node PD is set at the active potential, and the fourth transistor T4 and the fifth transistor T5 are turned on. The turned-on fourth transistor T4 transfers the low level voltage from the reference level terminal VGL to the output terminal OUT so that the output terminal OUT outputs an inactive level signal.

After that, the first capacitor C1 keeps the first node PU at an inactive potential, and the second capacitor C2 keeps the second node PD at an active potential. Since the second node PD is at the active potential, the fourth transistor T4 and the fifth transistor T5 are turned on. The turned-on fifth transistor T5 transfers the low level voltage from the reference level terminal VGL to the first node PU, ensuring that the first node PU is at an inactive potential. The turned-on fourth transistor T4 transfers the low level voltage from the reference level terminal VGL to the output terminal OUT, ensuring that the output terminal OUT outputs an inactive potential signal.

It will be understood that in various embodiments, although the transistors are illustrated and described as n-type transistors, p-type transistors are possible. In the case of a p-type transistor, the gate-on voltage has a low level and the gate-off voltage has a high level. In various embodiments, each transistor may, for example, be a thin film transistor, which is typically fabricated such that its first and second electrodes are used interchangeably. Other embodiments are also contemplated.

Figure 7A:
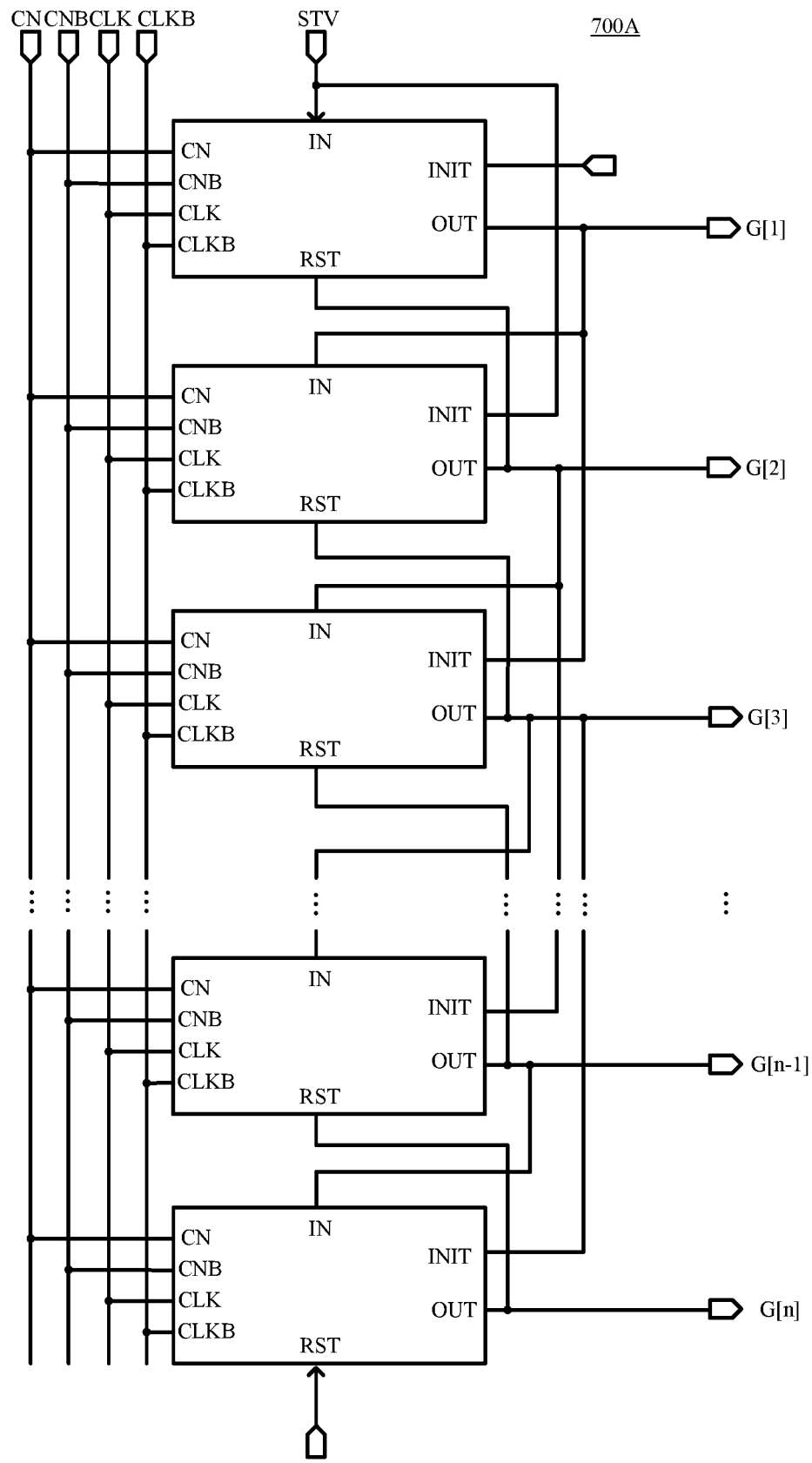
FIG. 7A is a block diagram of a gate drive circuit operating in a forward scan mode according to an embodiment of the present disclosure.
Figure 7B:
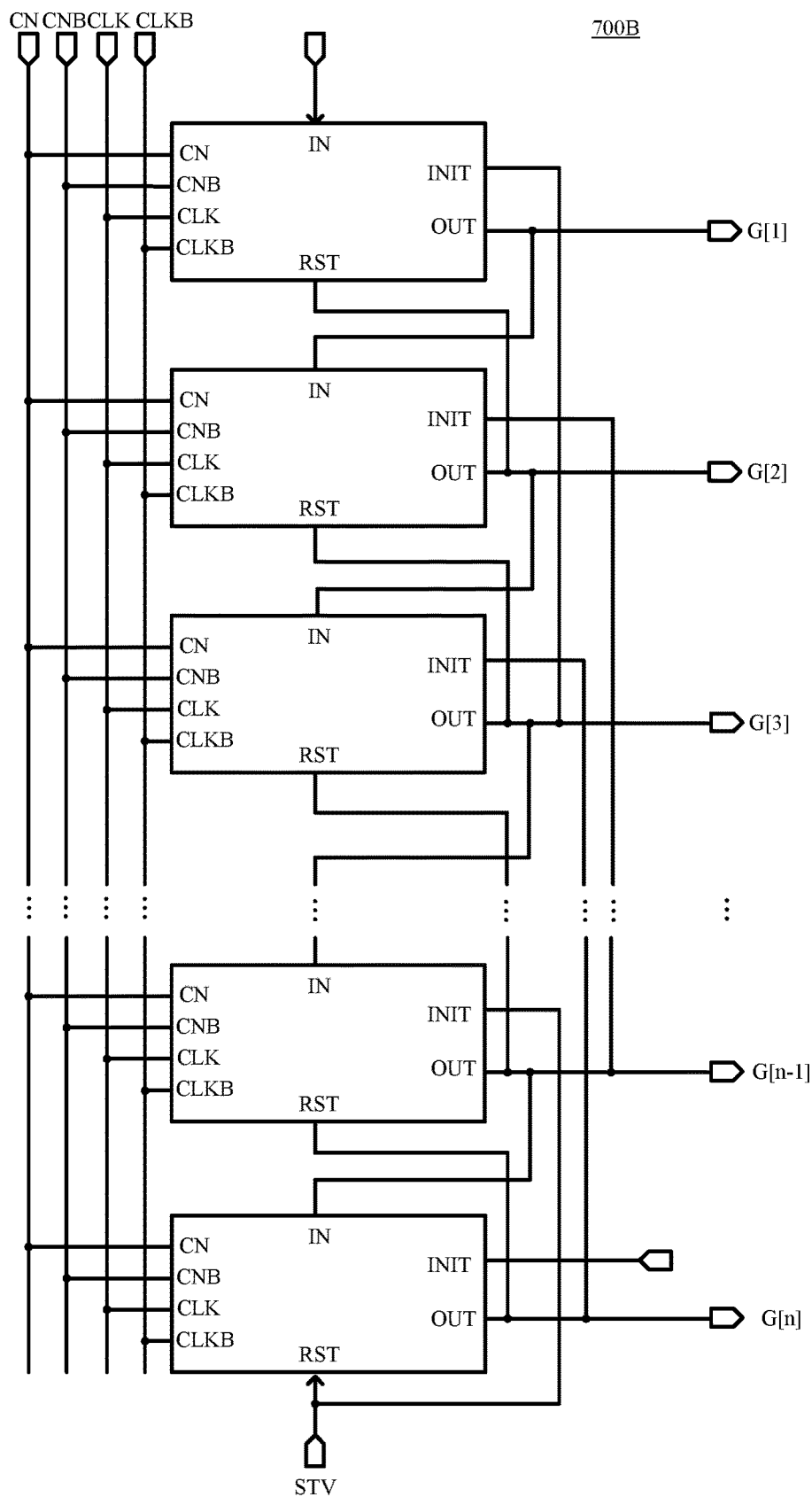
FIG. 7B is a block diagram of a gate drive circuit operating in a reverse scan mode according to an embodiment of the present disclosure.

FIG. 7A is a block diagram of a gate drive circuit 700A operating in a forward scan mode according to an embodiment of the present disclosure, and FIG. 7B is a block diagram of a gate drive circuit 700A operating in a reverse scan mode according to an embodiment of the present disclosure.

Referring to FIGS. 7A and 7B, the gate drive circuits 700A, 700B each include n cascaded shift register circuits, each of which may be the shift register circuit 100 or 200 as described above. The n shift register circuits are connected to n gate lines G[1], G[2], G[3], . . . , G[n−1] and G[n], respectively, to supply gate scan pulses to them. n may be an integer greater than or equal to two.

The input terminal IN of each of the shift register circuits, except the first shift register circuit, is connected to the output terminal OUT of the adjacent previous shift register circuit, and the reset terminal RST of each of the shift register circuits, except the n-th shift register circuit, is connected to the output terminal OUT of the next adjacent shift register circuit.

In the forward scan mode, as shown in FIG. 7A, the initialization terminal INIT of the k-th shift register circuit is connected to the output terminal OUT of the (k−2)-th shift register circuit, where k is an integer and 2<k≤n. In addition, the input terminal IN of the first shift register circuit receives a start signal STV as the input pulse, the initialization terminal INIT of the first shift register circuit receives the initialization pulse, and the initialization terminal INIT of the second shift register circuit receives the start signal STV as the initialization pulse.

In the reverse scan mode, as shown in FIG. 7B, the initializing terminal INIT of the k-th shift register circuit is connected to the output terminal of the (k+2)-th shift register circuit, where k is an integer and 1≤k≤n−2. In addition, the reset terminal RST of the n-th shift register circuit receives a start signal STV as the input pulse, the initialization terminal INIT of the n-th shift register circuit receives the initialization pulse, and the initialization terminal INIT of the (n−1)-th shift register circuits receives the start signal STV as the initialization pulse.

It will be understood that the input terminal IN and the reset terminal RST of the shift register circuit are used interchangeably depending on the scan mode. In the forward scan mode, the first scan level terminal CN supplies an active level voltage, the second scan level terminal CNB supplies an inactive level voltage, and the input terminal IN and the reset terminal RST are used as usual. In the reverse scan mode, the first scan level terminal CN supplies an inactive level voltage, and the second scan level terminal CNB supplies an active level voltage. In this case, as shown in FIG. 7B, the input terminal IN functions as a "reset terminal" and the reset terminal RST functions as an "input terminal."

Figure 8:
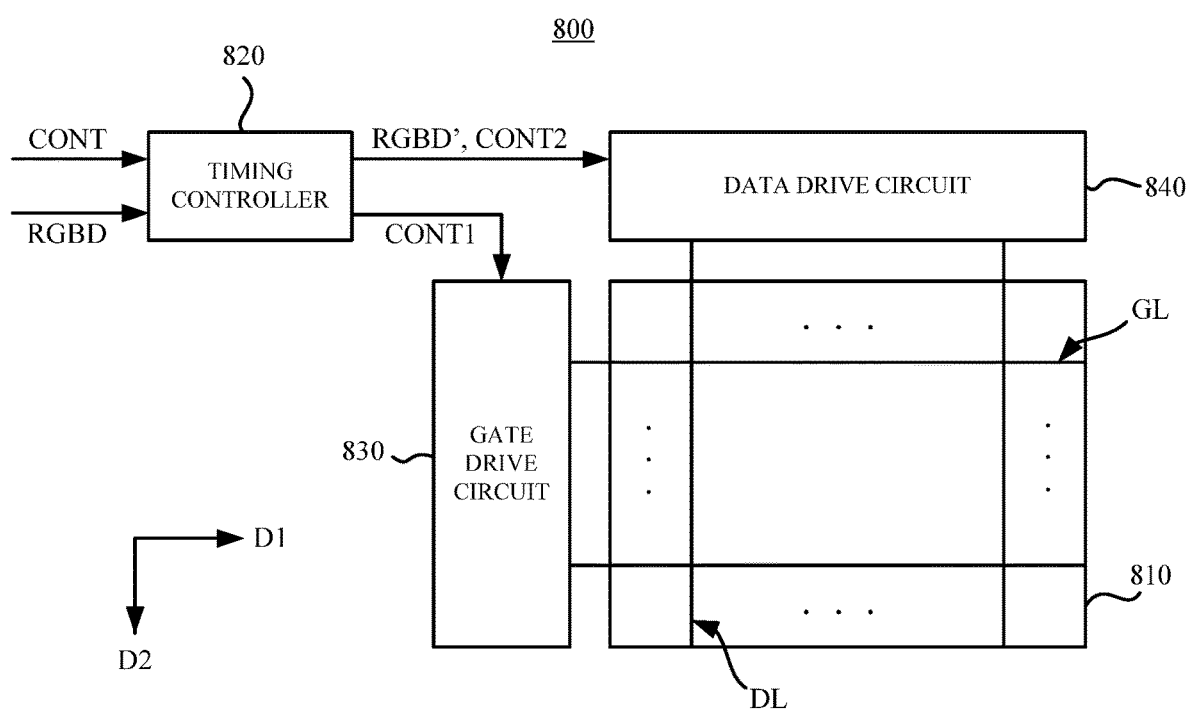
FIG. 8 is a block diagram of a display apparatus according to an embodiment of the present disclosure.

FIG. 8 is a block diagram of a display apparatus 800 according to an embodiment of the present disclosure. Referring to FIG. 8, the display apparatus 800 includes a display panel 810, a timing controller 820, a gate drive circuit 830, and a data drive circuit 840. The gate drive circuit 830 may be the gate drive circuit 700A or 700B described above with respect to FIGS. 7A and 7B.

The display panel 810 is connected to a plurality of gate lines GL and a plurality of data lines DL. The display panel 810 displays an image having a plurality of grayscales based on output image data RGBD'. The gate lines GL may extend in a first direction D1 and the data lines DL may extend in a second direction D2 that intersects (e.g., is substantially perpendicular to) the first direction D1. The display panel 810 may include a plurality of pixels (not shown) arranged in a matrix. Each of the pixels may be electrically connected to a corresponding one of the gate lines of the gate line GL and a corresponding one of the data lines DL. The display panel 810 may be a liquid crystal display panel, an organic light emitting diode (OLED) display panel, or other suitable type of display panel.

The timing controller 820 controls the operation of the display panel 810, the gate drive circuit 830, and the data drive circuit 840. The timing controller 820 receives input image data RGBD and input control signals CONT from an external device (for example, a host). The input image data RGBD may include a plurality of input pixel data for a plurality of pixels. Each input pixel data may include red, green, and blue grayscale data R, G, and B for a corresponding one of the plurality of pixels. The input control signals CONT may include a main clock signal, a data enable signal, a vertical synchronization signal, a horizontal synchronization signal, and the like. The timing controller 720 generates the output image data RGBD', a first control signal CONT1, and a second control signal CONT2 based on the input image data RGBD and the input control signal CONT.

The gate drive circuit 830 receives the first control signal CONT1 from the timing controller 820. The gate drive circuit 830 generates a plurality of gate signals for driving the gate lines GL based on the first control signal CONT1.

The gate drive circuit 830 may sequentially apply a plurality of gate signals to the gate lines GL.

The data drive circuit 840 receives the second control signal CONT2 and the output image data RGBD' from the timing controller 820. The data drive circuit 840 generates a plurality of data voltages (e.g., analog data voltages) based on the second control signal CONT2 and the output image data RGBD' (e.g., digital image data). The data drive circuit 840 may apply a plurality of data voltages to the data lines DL.

In certain exemplary embodiments, the gate drive circuit 830 and/or the data drive circuit 840 may be disposed (e.g., mounted directly) on the display panel 810 or may be connected to the display panel 810 by means of, for example, a Tape Carrier Package (TCP). In certain exemplary embodiments, the gate drive circuit 830 and/or the data drive circuit 840 may be integrated in the display panel 810.

Examples of the display apparatus 800 include, but are not limited to, cell phones, tablets, televisions, monitors, laptops, digital photo frames, and navigators.

It is apparent that various modifications and variations to the present disclosure can be made by those skilled in the art without departing from the spirit and scope of the disclosure. Thus, if these modifications and variations to the disclosure fall within the scope of the appended claims and equivalents thereof, the disclosure is also intended to encompass these modifications and variations.

What is claimed is:

1. A shift register circuit comprising:
    an initialization circuit configured to set a first node at an inactive potential in response to an initialization pulse from an initialization terminal being active;
    a first node control circuit configured to set the first node at an active potential in response to an input pulse from an input terminal being active and to set the first node at the inactive potential in response to at least one of a reset pulse from a reset terminal being active or a second node being at the active potential, the input pulse being immediately subsequent to the initialization pulse;
    a second node control circuit configured to set the second node at the inactive potential in response to the first node being at the active potential and to set the second node at the active potential in response to the first node being at the inactive potential and a first clock signal from a first clock terminal being active; and
    an output circuit configured to set an output terminal at the active potential in response to the first node being at the active potential and a second clock signal from a second clock terminal being active and to set the output terminal at the inactive potential in response to the second node being at the active potential;
    wherein the initialization circuit is further configured to set the first node at the inactive potential by way of the first node control circuit by setting the second node at the active potential.

2. The shift register circuit of claim 1, wherein the first node control circuit comprises:
    a first transistor having a gate connected to the input terminal, a first electrode connected to the first node, and a second electrode connected to a first scan level terminal;
    a second transistor having a gate connected to the reset terminal, a first electrode connected to a second scan level terminal, and a second electrode connected to the first node; and
    a fifth transistor having a gate connected to the second node, a first electrode connected to the first node, and a second electrode connected to a reference level terminal supplying the inactive potential.

3. The shift register circuit of claim 1, wherein the second node control circuit comprises:
    a sixth transistor having a gate connected to the first node, a first electrode connected to a reference level terminal supplying the inactive potential, and a second electrode connected to the second node; and
    a seventh transistor having a gate connected to the first clock terminal, a first electrode connected to the second node, and a second electrode connected to the first clock terminal.

4. The shift register circuit of claim 3, wherein the second node control circuit further comprises a second capacitor connected between the second node and the reference level terminal.

5. The shift register circuit of claim 1, wherein the output circuit comprises:
    a third transistor having a gate connected to the first node, a first electrode connected to the output terminal, and a second electrode connected to the second clock terminal;
    a first capacitor connected between the first node and the output terminal; and
    a fourth transistor having a gate connected to the second node, a first electrode connected to a reference level terminal supplying the inactive potential, and a second electrode connected to the output terminal.

6. The shift register circuit of claim 1, wherein the initialization circuit comprises an eighth transistor having a gate connected to the initialization terminal, a first electrode connected to the initialization terminal, and a second electrode connected to the second node.

7. A method of driving the shift register circuit of claim 1, the method comprising:
    setting the first node at the inactive potential in response to the initialization pulse from the initialization terminal being active, wherein the initialization pulse being immediately prior to the input pulse applied to the input terminal.

8. A gate drive circuit comprising n cascaded shift register circuits as claimed in claim 1, n being an integer greater than or equal to 2, wherein:
    the input terminal of each of the shift register circuits, except a first one of the shift register circuits, is connected to the output terminal of an adjacent previous shift register circuit; and
    the reset terminal of each of the shift register circuits, except an n-th one of the shift register circuits, is connected to the output terminal of an adjacent next shift register circuit.

9. The gate drive circuit of claim 8, wherein the gate drive circuit is configured to operate in a forward scan mode, wherein:
    the input terminal of the first shift register circuit is operative to receive a start signal as the input pulse;
    the initialization terminal of the first shift register circuit is operative to receive the initialization pulse;
    the initialization terminal of a second one of the shift register circuits is operative to receive the start signal as the initialization pulse; and
    the initializing terminal of a k-th one of the shift register circuits is connected to the output terminal of a (k−2)-th one of the shift register circuits, k being an integer and 2<k≤n.

10. The gate drive circuit of claim 8, wherein the gate drive circuit is configured to operate in a reverse scan mode, wherein:
  the reset terminal of the n-th shift register circuit is operative to receive a start signal as the input pulse;
  the initialization terminal of the n-th shift register circuit is operative to receive the initialization pulse;
  the initialization terminal of an (n−1)-th one of the shift register circuits is operative to receive the start signal as the initialization pulse; and
  the initializing terminal of a k-th one of the shift register circuits is connected to the output terminal of a (k+2)-th one of the shift register circuits, k being an integer and $1 \leq k \leq n-2$.

11. A display apparatus comprising the gate drive circuit as claimed in claim 8.

* * * * *